United States Patent
Sakurai et al.

[11] Patent Number: 5,962,877
[45] Date of Patent: Oct. 5, 1999

[54] INVERTER APPARATUS HAVING IMPROVED SWITCHING ELEMENT

[75] Inventors: Naoki Sakurai, Hitachi; Masahiro Nagasu, Hitachinaka, both of Japan

[73] Assignee: Hitachi, Ltd., Tokyo, Japan

[21] Appl. No.: 08/886,573

[22] Filed: Jul. 1, 1997

Related U.S. Application Data

[62] Division of application No. 08/504,422, Jul. 20, 1995.

[30]   Foreign Application Priority Data

Jul. 25, 1994   [JP]   Japan ................................. 6-172274

[51] Int. Cl.$^6$ ........................... H01L 29/74; H01L 31/111
[52] U.S. Cl. ......................... 257/139; 257/147; 257/133
[58] Field of Search ..................... 257/133, 139, 257/147, 151, 152; 363/37, 138, 96

[56]   References Cited

U.S. PATENT DOCUMENTS 4,716,515  12/1987  Alexander ............................. 363/138
5,202,750   4/1993  Gough .................................. 257/133

Primary Examiner—Wael M. Fahmy
Attorney, Agent, or Firm—Antonelli, Terry, Stout & Kraus, LLP

[57]   ABSTRACT

An inverter with an improved semiconductor device is provided having a pn junction composed of a first semiconductor layer made of a first conductivity type semiconductor and a second semiconductor layer made of a second conductivity type semiconductor having a wider band-gap than that of the first semiconductor layer.

8 Claims, 14 Drawing Sheets

[BEFORE CONTACTING]

[AFTER CONTACTING]

[BEFORE CONTACTING]

[AFTER CONTACTING]

[BEFORE CONTACTING]

[AFTER CONTACTING]

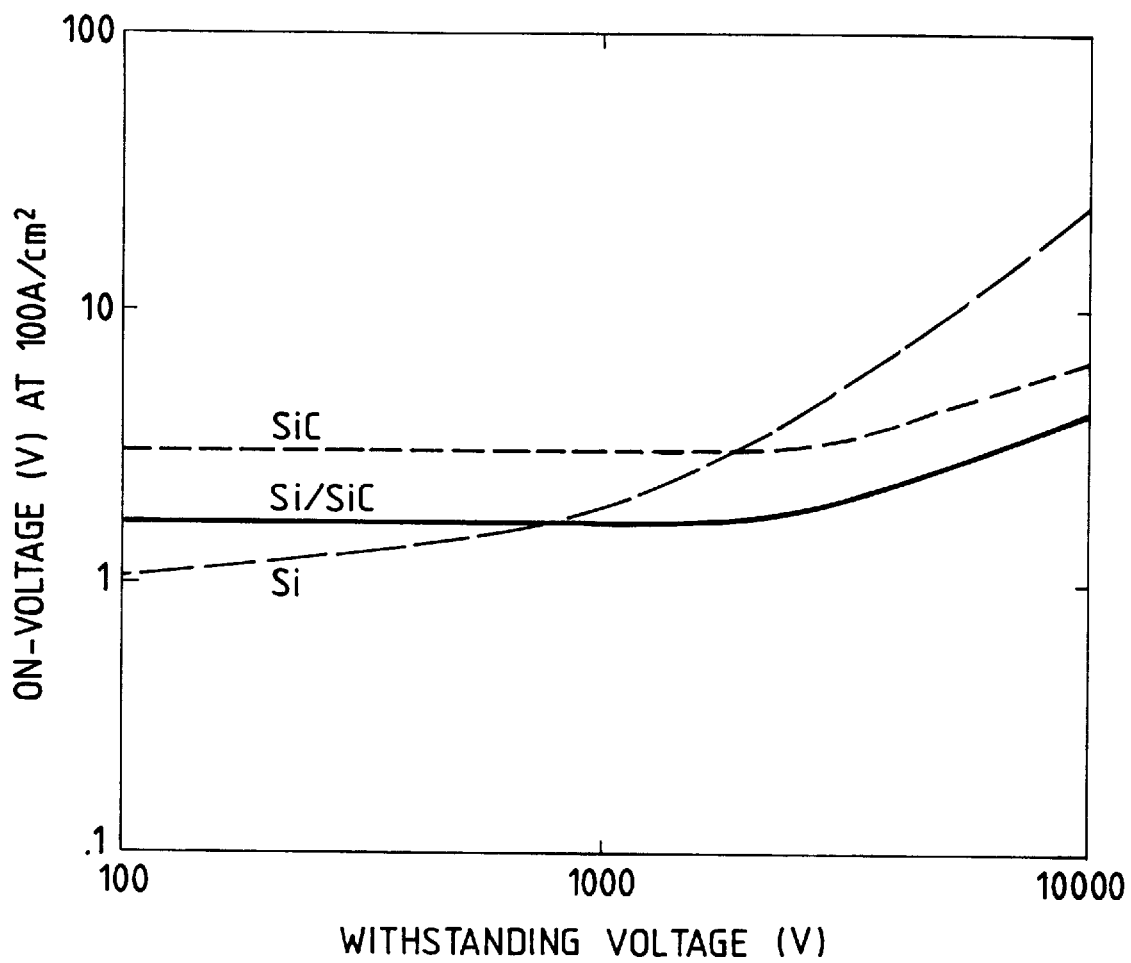

INVERTER APPARATUS HAVING IMPROVED SWITCHING ELEMENT

This application is a Divisional application of application Ser. No. 08/504,422, filed Jul. 20, 1995.

BACKGROUND OF THE INVENTION

1. Field of the Invention

The present invention relates to a semiconductor device, and more particularly to a low-loss power semiconductor device.

2. Description of the Related Art

Recently, low-loss semiconductor devices have been developed. One type is an Insulated Gate Bipolar Transistor (IGBT), invented during the middle 1980s. The ON-voltage of the first generation IGBT at the early period of the development was 4 V, the ON-voltage of the second generation IGBT developed in 1988 was 3 V, and the ON-voltage of the third generation IGBT developed in 1991 was 2.4 V. Thus, as can be seen above, the power loss of IGBTs have been rapidly reduced. Further, a lower-loss device has been developed to provide the basis for developing a fourth generation IGBT having an ON-voltage of 1.5 V. The following is an outline detailing a process for developing a low-loss IGBT device.

In FIG. 1, a cross-sectional view of a conventional IGBT structure is shown. A n− layer is formed on a substrate forming a p+ layer. The n− layer secures a withstanding voltage by extending a depletion layer and relaxing an electric field. A gate electrode is formed at the surface of the n− layer via an oxide film. A p layer is formed in the n− layer at both terminals of a gate electrode, and an n+ layer is formed in the p layer. The n+ layer and the p layer are short-circuited by an emitter electrode. A collector electrode is connected to the n+ layer by ohmic contact. The semiconductor device operates as follows. At first, positive voltage is applied to the collector and the gate, in contradistinction to voltage applied to the emitter. If the voltage applied to the gate electrode exceeds a threshold value, the inversion occurs in the p layer under the gate electrode and electrons flow into the n− layer. Then, by the electrons, the forward bias is applied to a pn junction formed by the n− layer and the p+ layer, and if the voltage applied to the pn junction exceeds diffusion potential, holes are injected from the p+ layer to the n− layer. Then, electrical conduction of the n− layer having high resistance is modulated by the injected holes, and the high resistance is decreased.

Since the amount of hole current is determined by the amount of electron current from MOSFET formed at the device surface as mentioned above, lowering the loss was conventionally realized by decreasing a channel resistance of MOSFET and increasing the electron current. The below-mentioned methods have been adopted as the method of decreasing the channel resistance, that is, (1) decrease of the channel width per unit area by reducing the length of the p layer and the n+ layer of the emitter by use of an advanced fine processing technique; (2) decrease of the channel width by reducing the thickness of the n+ layer and the p layer; and (3) decrease of the thickness of the oxide film at the gate electrode.

The length of a gate should be kept more than a definite value since the region in which electrons flow is narrowed by extension of the depletion layer from the p layer. Since the ratio of the length of a gate to that of an emitter forming region has reached about (6:1) already in the third generation IGBT, the channel width per unit area is not increased so much by making the emitter region finer and the decrease of the thickness of a p layer is limited since the withstanding voltage has to be secured. Further, the thickness of a gate oxide film can not be decreased more since the gate voltage is fixed. Therefore, the method of increasing electron current by decreasing the channel resistance of MOSFET has reached its limit.

In view of the foregoing discussion, it is clear that the current does not flow in the IGBT until the pn junction is biased forward. The forward bias voltage is about 1 V in a conventional IGBT made with silicon, about 40% of the ON-voltage of 2.4 V for the third generation IGBT, and about 70% of the ON-voltage of 1.5 V for the fourth generation IGBT. The forward bias voltage applied to the pn junction can be decreased by narrowing a band-gap of semiconductor. For example, use of germanium instead of silicon has proven to be effective. However, in a semiconductor having a narrow band-gap, the loss becomes larger since the leak current increases in the high temperature state.

SUMMARY OF THE INVENTION

Objects of the Invention

In consideration of the above-described problems, it is an objective of the present invention to provide a semiconductor device with low loss and low leak current.

Methods Solving the Problems

A semiconductor device in accordance with the present invention has a first semiconductor layer made with a first conduction type semiconductor and a second layer made with a second conduction type semiconductor adjoining the first semiconductor layer. Then, insofar as the second conduction type semiconductor is concerned, a semiconductor having a wider band-gap than that of the first conduction type semiconductor is used. Further, the semiconductor device of the present invention has the third semiconductor layer made with the first conduction type semiconductor formed in the second semiconductor layer, and the fourth semiconductor layer is made with the second conduction type semiconductor, formed in the third semiconductor layer.

The pn junction formed by the second and third semiconductor is reversely biased in the voltage stopping state and the withstanding voltage is secured. And majority carrier are fed from the fourth semiconductor layer to the second semiconductor layer in the ON state. Since the pn junction formed by the first and the second semiconductor layer is biased forward by the majority carrier, minority carrier are injected from the first semiconductor layer into the second semiconductor layer.

And the energy barrier to the injection of carriers from the first semiconductor can be lowered by making the band-gap of the semiconductor used to the first semiconductor layer narrower than that of the semiconductor used to the second semiconductor layer. Then, since voltage decrease at the pn junction is decreased in the ON state, the loss of a semiconductor device can be reduced. Further, the leak current can be decreased by making the band-gap of the semiconductor used to the second semiconductor layer for securing the withstanding voltage, larger than that of the semiconductor used to the first semiconductor layer.

BRIEF DESCRIPTION OF THE DRAWINGS

FIG. 8 shows a relationship between the ON-voltage and the withstanding voltage of each of three IGBTs made of Si and SiC, only Si, and only SiC, respectively.

DETAILED DESCRIPTION OF THE EMBODIMENTS

Hereinafter, details of the present is explained based on embodiments referring to drawings.

Figure 1:
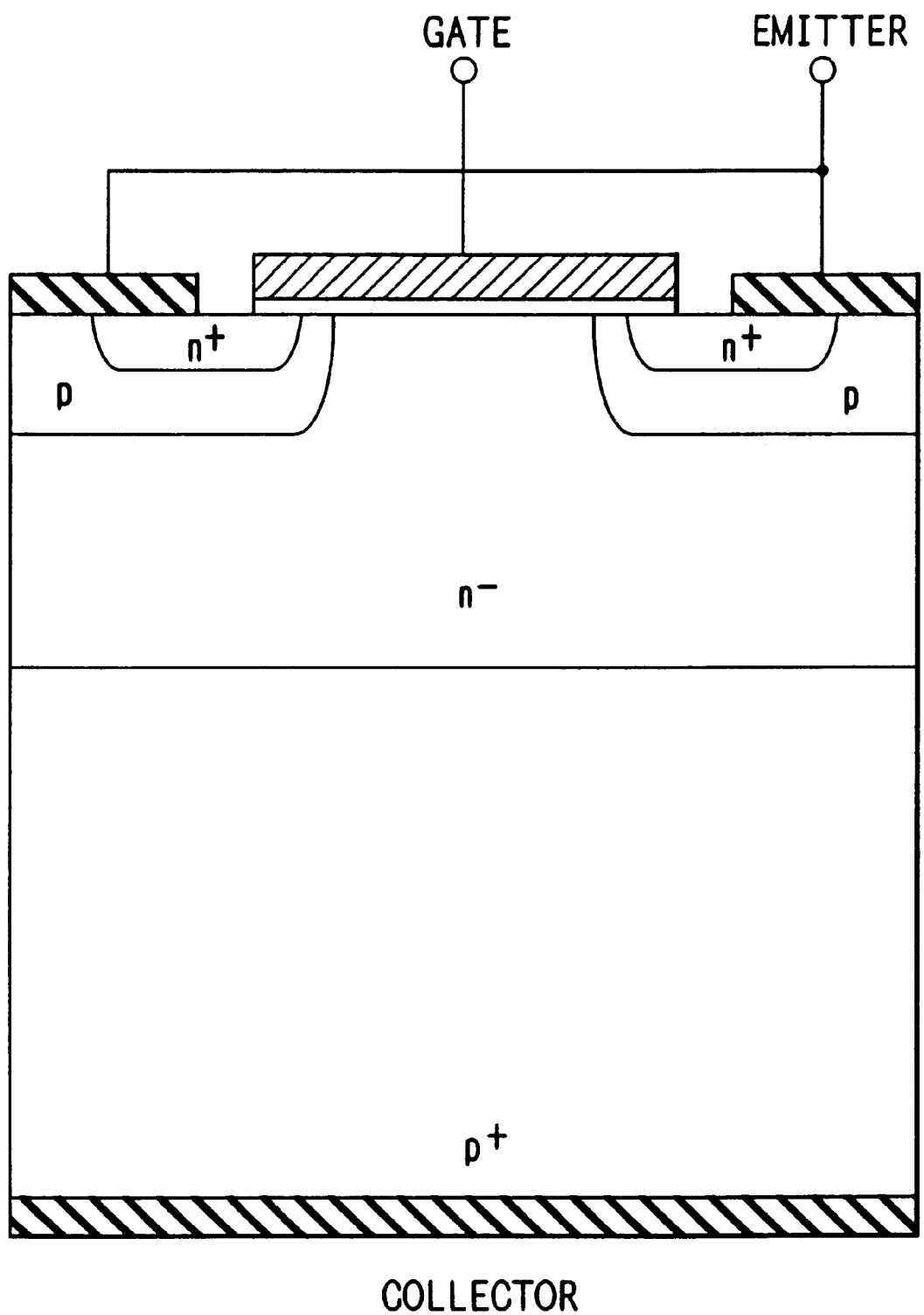
FIG. 1 shows a cross section of a conventional IGBT.
Figure 2:
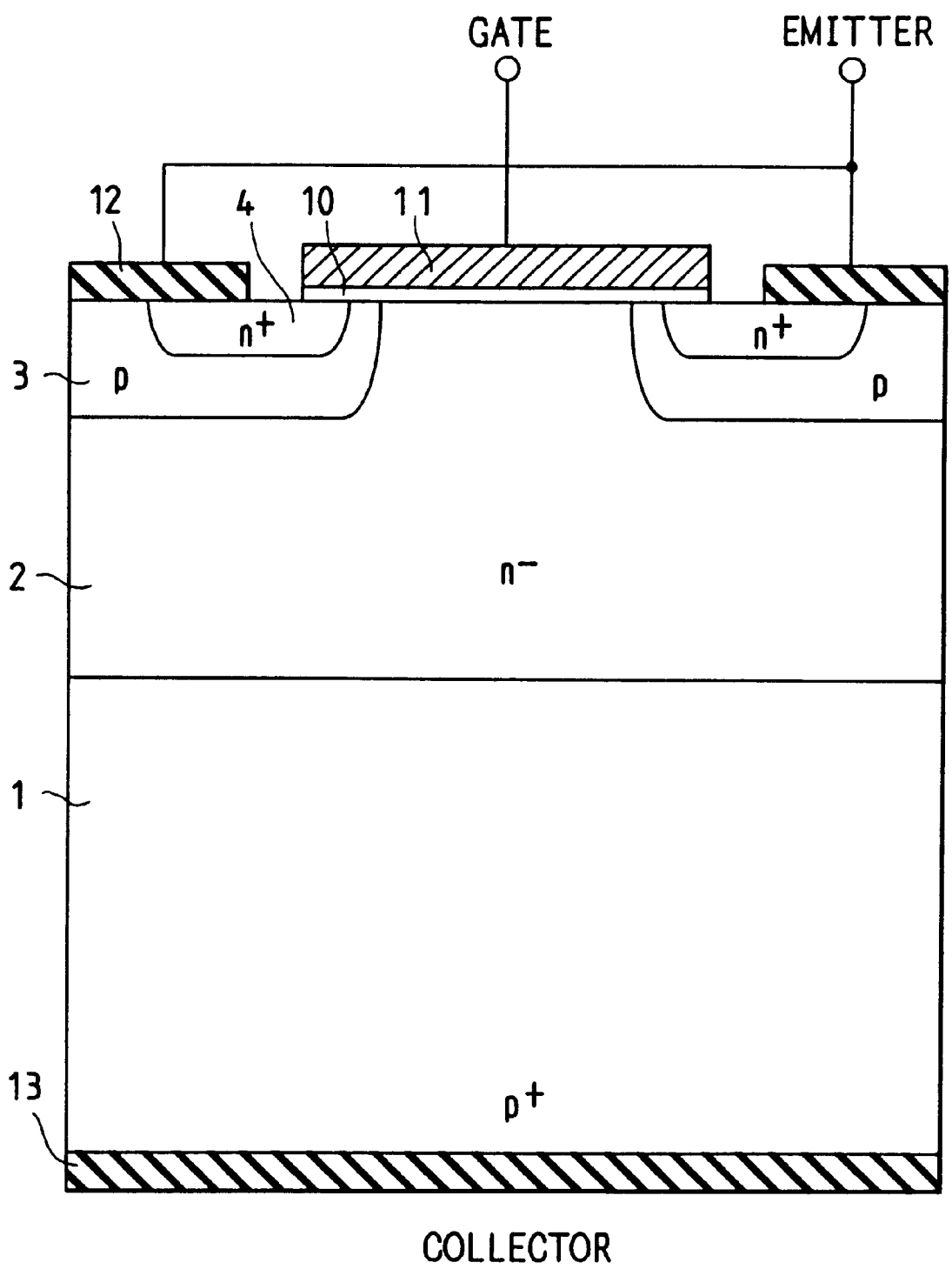
FIG. 2 shows a cross-sectional structure of an IGBT in accordance with a first embodiment of the present invention.

FIG. 2 shows a cross-sectional structure of IGBT of the first embodiment. In the embodiment, IGBT is explained as an example. On a p+ substrate (a first semiconductor layer), made from a first conduction type semiconductor (hereinafter described as "the first semiconductor") having the first band-gap, an n− layer 2 (the second semiconductor layer), made from a second conduction type semiconductor (hereinafter described as "the second semiconductor") having a wider band-gap than that of the first semiconductor, is formed. At one surface of the n− layer 2, an insulated gate electrode 11 is formed on an oxide film 10. At each of two terminals of the gate electrode 11, a p layer 3 (the third semiconductor layer) is formed in the n− layer 2, and an n+ layer 4 (the fourth semiconductor layer) is further formed in the p layer 3. A collector electrode 13 (the first main electrode) is connected to the p+ layer 1 by ohmic contact. The n+ layer 4 and the p layer 3 are short-circuited by an emitter electrode 12 (the second main electrode).

Since the height of a barrier to holes can be lowered by using the first semiconductor having a narrow band-gap for the p+ substrate, as compared with the case that all semiconductor layers are made with the second semiconductor, the embodiment can reduce the voltage required for injecting holes into the n− layer, and also the ON-voltage. Further, since the n− layer, for extending a depletion layer and securing the withstanding voltage, is made with the second semiconductor having a wide band-gap, the leak current can be lowered compared to the case where all semiconductor layers are made with the first semiconductor having a narrow band-gap.

Figure 3A:
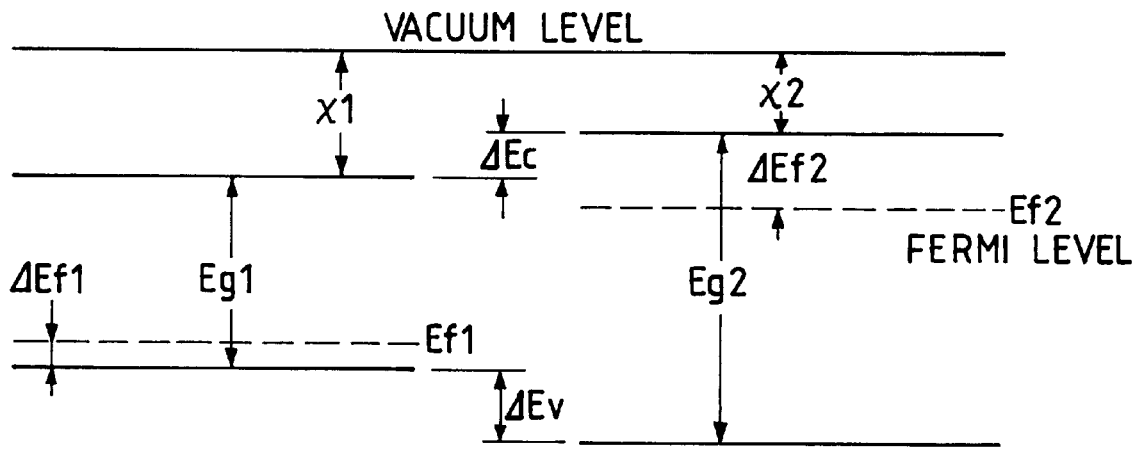
FIG. 3(a) shows energy bands of a p+ layer 1 and a n− layer 2 before contacting occurs with respect to both layers.
Figure 3B:
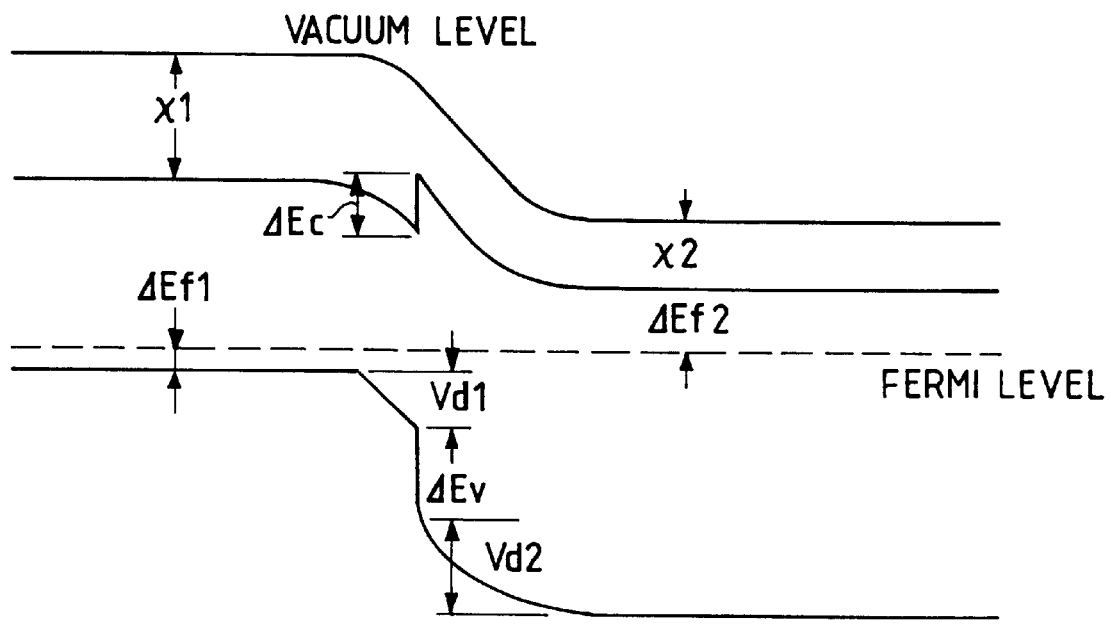
FIG. 3(b) shows energy bands of a p+ layer 1 and a n− layer 2 after contacting occurs with respect to both layers.

Following there is provided an explanation of how much the ON-voltage is reduced, referring to figures describing energy bands. FIG. 3(a) shows energy bands of a p+ layer 1 and a n− layer 2 before contacting occurs with respect to both layers. And FIG. 3(b) shows energy bands of a p+ layer 1 and a n− layer 2 after contacting occurs with respect to both layers. In the figures, $\chi_i$ is electron affinity, $Eg_i$ band-gap, $Ef_i$ Fermi level, $\Delta Ef_i$ the difference between the bottom of a conduction band and $Ef_i$ ((the bottom of a conduction band)−$Ef_i$) and $Vd_i$ diffusion potential, respectively. The suffix i where {i=1} means the first semiconductor and the suffix i where {i=2} means the second semiconductor.

After the two semiconductor layers are contacted to each other and reach the thermal equilibrium, the chemical potential is equal over the system of the two semiconductor layers since carriers do not move. Therefore, Fermi levels of the layers are conformed to each other. Further, at the contact surface, the discontinuity of an energy band appears corresponding to the electron affinity difference and the band-gap difference. The discontinuity in the conduction band $\Delta Ec$ and the discontinuity in the valence band $\Delta Ev$ are expressed by the following equations, respectively.

$$\Delta Ec = \chi_2 - \chi_1 \tag{1}$$

$$\Delta Ev = Eg_2 - Eg_1 - \Delta Ec \tag{2}$$

Then, the barrier to holes, Vh(hetero), is expressed as $$Vh(\text{hetero}) = \Delta Ev + Vd_1 + Vd_2,$$

where $\{Vd_1 + Vd_2\}$ is the diffusion potential of the whole pn junction and equals to the difference between the two Fermi levels. Then, the following equation is obtained.

$$Vh(\text{hetero}) = \Delta Ev + (Eg_1 - \Delta Ef_1 - \Delta Ef_2 + \Delta Ec) \tag{3}$$

On the other hand, the barrier to holes, Vh(homo), at the pn junction of the layers made with only the second semiconductor is expressed as $$Vh(\text{homo}) = Eg_2 - \Delta Ef_1 - \Delta Ef_2',$$

where $\Delta Ef_2'$ is the difference between the Fermi level and the valence band of the p+ layer made with the second semiconductor. Then, the following equation is obtained.

$$Vh(\text{homo}) - Vh(\text{hetero}) = Eg_2 - Eg_1 - \Delta Ef_2 - \Delta Ef_2' - \Delta Ev - \Delta Ec \tag{4}$$

Then, in the embodiment, the p+ layer 1 includes the sufficient impurity density so that $\Delta Ef_2'$, $\Delta Ef_2 \ll Eg_1$, $Eg_2$, $\Delta Ev$, $\Delta Ec$. Then, Eq.(4) is expressed as follows.

$$Vh(\text{homo}) - Vh(\text{hetero}) = Eg_2 - Eg_1 - \Delta Ev - \Delta Ec \tag{5}$$

In order to make the ON-voltage lower as compared with the case that the pn junction is made with the second semiconductor, it is needed that Vh(homo)>Vh(hetero). Then, as seen from Eq.(5), it is necessary that the band-gap of the first semiconductor is narrow, and both the discontinuity of the conduction band ΔEc and the discontinuity of the valence band ΔEv are small.

Figure 4:
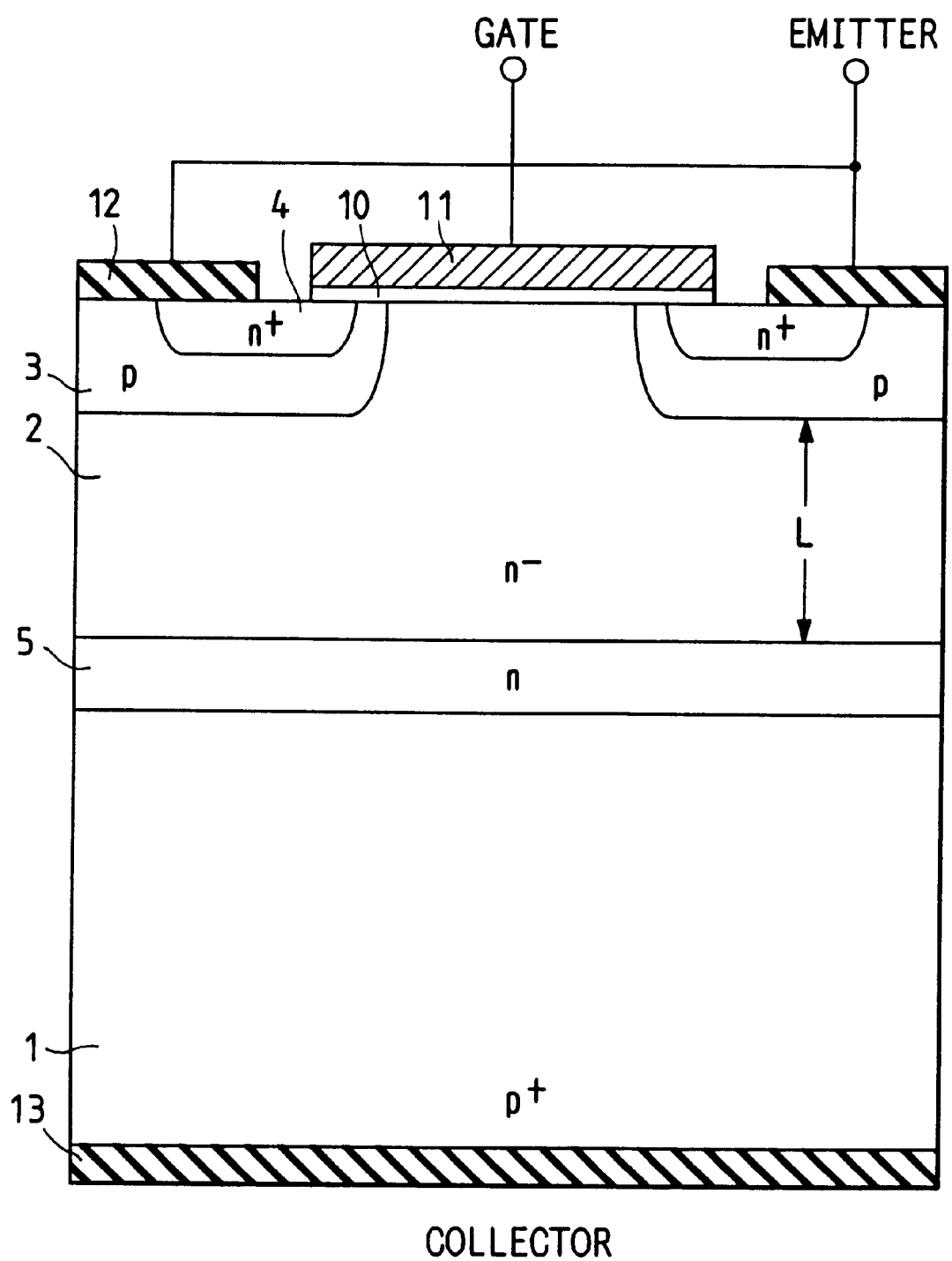
FIG. 4 shows a cross-sectional structure of an IGBT in accordance with a second embodiment of the present invention.

FIG. 4 shows a cross-sectional structure of an IGBT of a second embodiment of the present invention. An n layer 5 (the fifth semiconductor layer) made with the first semiconductor is formed on the p+ substrate 1, and, on the fifth semiconductor layer, the n− layer made with the second semiconductor is formed. The impurity density of the n layer 5 is higher than that of the n− layer 2. The n layer 5 prevents the depletion layer from reaching the p+ layer 1 and further punching through the p+ layer 1.

Figure 5A:
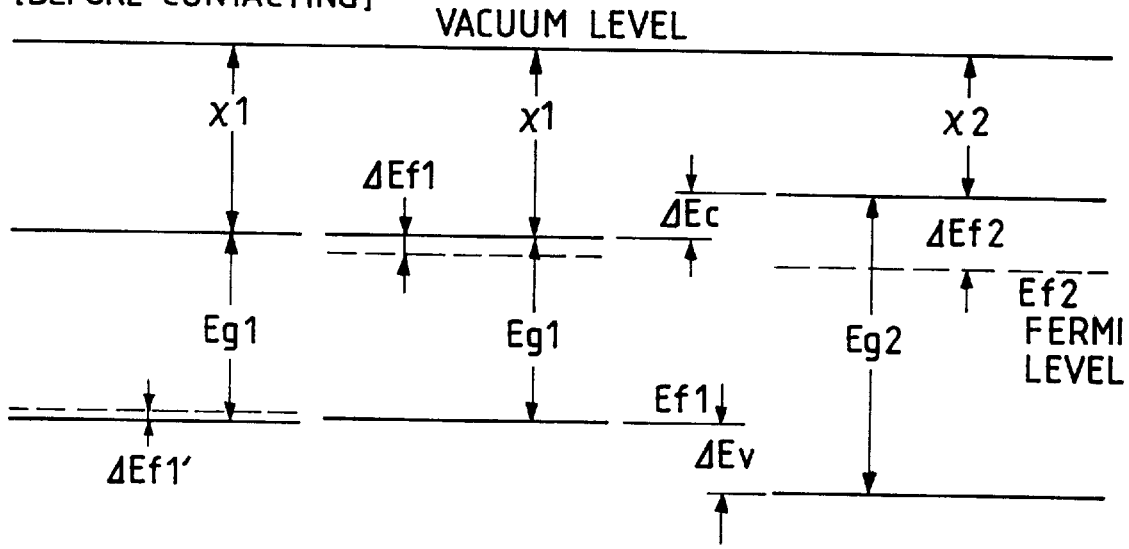
FIG. 5(a) shows energy bands of a p+ layer 1, a n layer and a n− layer in case $\Delta Ef_1 < \Delta Ef_2$, before contacting occurs with respect to the layers.
Figure 5B:
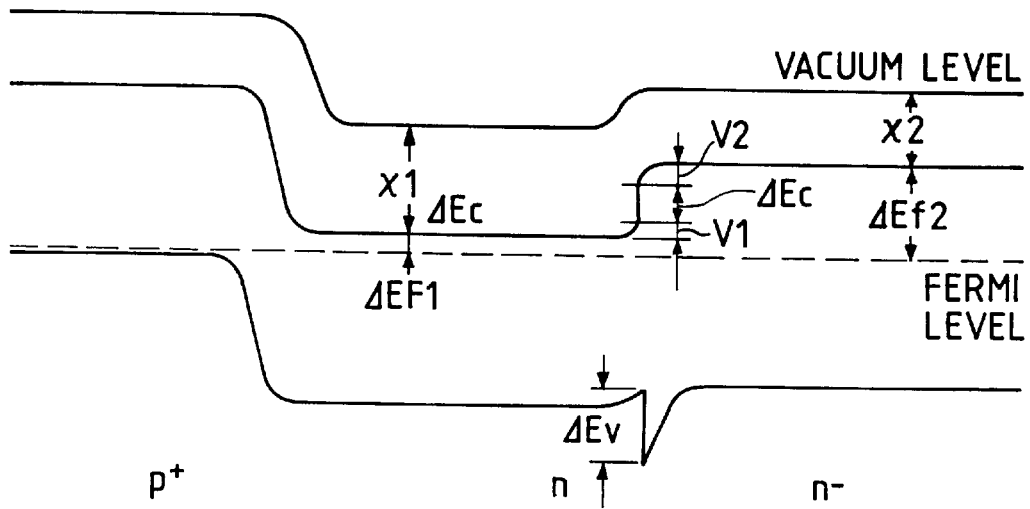
FIG. 5(b) shows energy bands of a p+ layer 1, a n layer and a n− layer in case $\Delta Ef_1 < \Delta Ef_2$, after contacting occurs with respect to the layers.
Figure 6A:
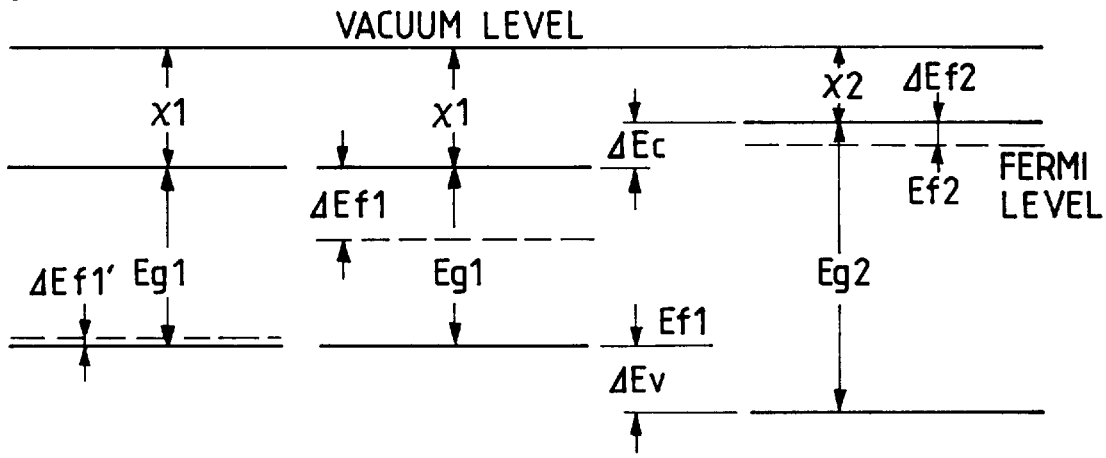
FIG. 6(a) shows energy bands of a p+ layer 1, a n layer and a n− layer in case $\Delta Ef_1 > \Delta Ef_2$, before contacting occurs with respect to the layers.
Figure 6B:
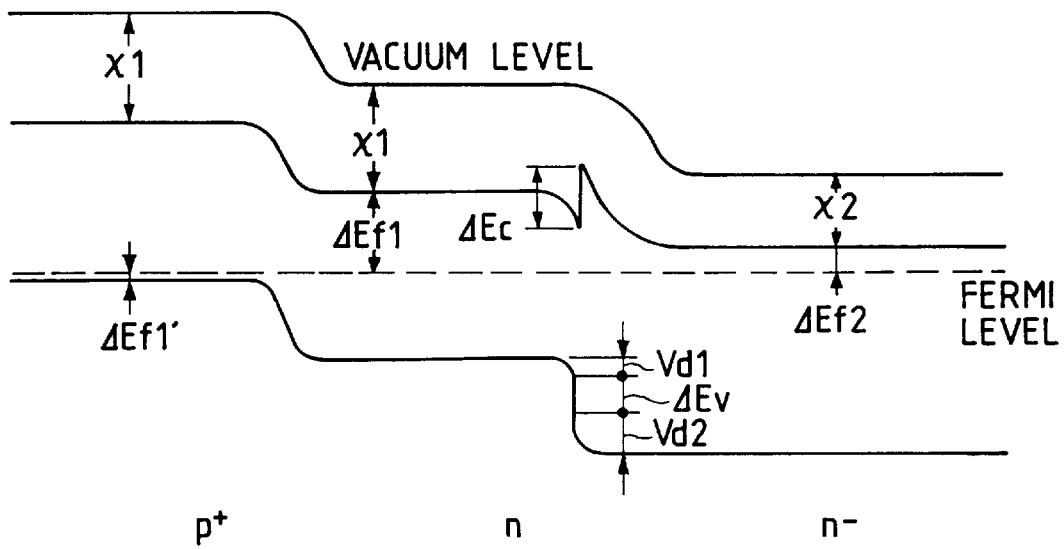
FIG. 6(b) shows energy bands of a p+ layer 1, a n layer and a n− layer in case $\Delta Ef_1 > \Delta Ef_2$, after contacting occurs with respect to the layers.

In the second embodiment, energy band structures of the n layer 5 and the n− layer 2 are shown in FIGS. 5(a),5(b) and FIGS. 6(a),6(b). FIG. 5(a) shows energy bands of a p+ layer 1, an n layer and an n− layer in the case where $\Delta Ef_1 < \Delta Ef_2$, before contacting occurs with respect to the layers. And FIG. 5(b) shows energy bands of a p+ layer 1, an n layer and an n− layer in the case where $\Delta Ef_1 < \Delta Ef_2$, after contacting occurs with respect to the layers. Further, FIG. 6(a) shows energy bands of a p+ layer 1, an n layer and an n− layer in the case where $\Delta Ef_1 > \Delta Ef_2$, after contacting occurs with respect to the layers. After contacting of the layers occurs, electrons move from the layer of a large Fermi level difference to the layer of a small Fermi level difference and form an accumulation layer. In the case where $\Delta Ef_1 < \Delta Ef_2$, the accumulation layer is formed in the n layer 5. Therefore, the barrier by diffusion potential is formed to electrons and the barrier of the n/n− junction to holes equals the discontinuity of the valence band ΔEv. Since the pn junction is made with the first semiconductor, the barrier to holes is given by the difference between Fermi level of the p+ layer 1 and Fermi level of the n layer 5. And since the impurity density of the p+ layer is high, the Fermi level of the layer almost equals the valence band, that is, $\Delta Ef_1'$ is almost 0. As a result, the following equation is obtained.

$$Vh(hetero) = Eg_1 - \Delta Ef_1 + \Delta Ev \tag{6}$$

In the case where $\Delta Ef_1 > \Delta Ef_2$, the accumulation layer is formed in the n− layer 2. Since the barrier by diffusion potential is formed to holes, the barrier of the n/n− junction to holes $\{Vd_1 + Vd_2 + \Delta Ev\}$ equals $\{\Delta Ef_1 + \Delta Ec - \Delta Ef_2 + \Delta Ev\}$. The following equation is therefore obtained.

$$Vh(hetero) = Eg_1 - \Delta Ef_2 + \Delta Ev \tag{7}$$

The barrier to holes Vh(homo) in the case where the pn junction is made with the second semiconductor is given by Eq. (8):

$$Vh(homo) = Eg_2 - \Delta Ef_2'' \tag{8}$$

where $\Delta Ef_2''$ is the difference between Fermi level and the conduction band of the n layer 5, and is assumed that is made with the second semiconductor. From Eqs.(7) and (8), in the case where $\Delta Ef_1 < \Delta Ef_2$, then, $$Vh(homo) - Vh(hetero) = Eg_2 - Eg_1 - \Delta Ef_1 + \Delta Ev - \Delta Ef_2'' \tag{9}$$

and in the case where $\Delta Ef_1 > \Delta Ef_2$, then, $$Vh(homo) - Vh(hetero) = Eg_2 - Eg_1 - \Delta Ef_2 + \Delta Ev + \Delta Ec - \Delta Ef_2'' \tag{10}$$

From Eqs.(9) and (10), it is seen that the ON-voltage can be reduced by using the semiconductor having a narrow band-gap and making the difference between Fermi level and the conduction band as large as possible.

In comparing Eq.(9) and Eq.(10), it is found that Eq.(9) does not include the term ΔEc. Therefore, the case where $\Delta Ef_1 < \Delta Ef_2$ is preferable to reducing the ON-voltage.

From the foregoing discussion, it becomes apparent that what kinds of materials are to be selected as the first and the second semiconductor is decided by considering a number of conditions, such as where the first semiconductor has a narrower band gap than that of the second semiconductor and that such a large crystal can be obtained be either of two kinds of semiconductors that a substrate can be made by the crystal. As a combination satisfying such conditions, the combination of Germanium as the first semiconductor and Silicon as the second semiconductor can be available. And the combination of GaAs as the first semiconductor and AlGaAs as the second semiconductor is also available. Further, a semiconductor having a large breakdown voltage is preferable for securing the withstanding voltage as the second semiconductor. As a combination satisfying the last condition too, the combination of Silicon as the first semiconductor and SiC as the second semiconductor can be used. The breakdown voltage of SiC is $2 \times 10^{16}$ V/cm, which is larger by a figure than the value of $2 \times 10^{15}$ V/cm of Si. Then, since the thickness of the n− layer 2 can be decreased, the ON-voltage can be decreased even more as compared with the case where the n− layer is made of silicon. Then, the band-gap of SiC is so large of 2.93 V that a device having the n− layer 2 made of SiC is capable of operating in the higher temperature state than a device having the n− layer 2 made with silicon.

Following there is provided an explanation of how much the embodiment using Si as the first semiconductor and SiC, as the second semiconductor can reduce the ON-voltage.

In the embodiment, the impurity density of the n layer 5 is $1 \times 10^{17}$ and that of the n− layer 2 is $5 \times 10^{14}/cm^3$. Then, the difference between Fermi level and the conduction band ΔEf is given as follows:

$$\Delta Ef = Ei - k \cdot T \cdot \ln(Nd/ni) \tag{11}$$

where Ei is the intrinsic Fermi level (=½ of the band-gap), k Bolzman constant, T the absolute temperature, Nd impurity density and ni carrier density of intrinsic semiconductor. Under the condition where a room temperature is 300 K, in Si, Ei=0.56 eV and ni=$1.5 \times 10^{10}/cm^3$, and in SiC, Ei=1.47 eV and ni=$1.05 \times 10^6/cm^3$.

Then, $\Delta Ef_1$=60 meV and $\Delta Ef_2$=0.59 eV.

Since $\Delta Ef_1 < \Delta Ef_2$, $$Vh(hetero) = Eg_1 - \Delta Ef_1 + \Delta Ev$$

$$= 1.12 - 0.06 + 0.54 = 1.6 \text{ eV}.$$

If the semiconductor layers are made with only SiC, $$Vh(homo) = Eg_2 - \Delta Ef_2''$$

$$= 2.94 - 0.11 = 2.83 \text{ eV}.$$

Since the semiconductor layers forming the pn junction in the invention is made with silicon, the ON-voltage is reduced by 1.2 V as compared with the case where all the semiconductor layers are made with SiC.

Figure 7:
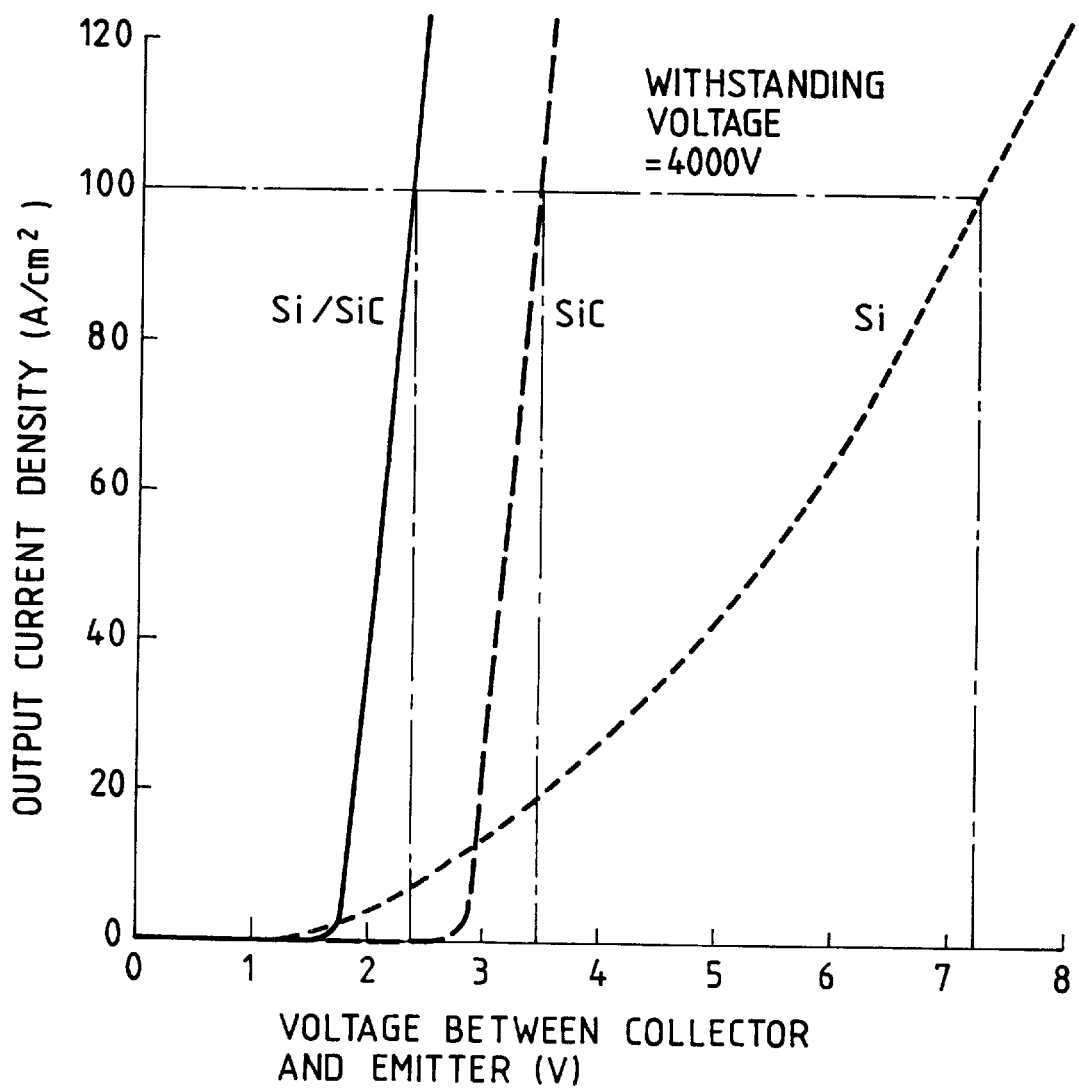
FIG. 7 shows output characteristics of an IGBT in a case where its withstanding voltage is of a 4000 V class and its current density is 100 A/cm$^2$ at the rated current.

FIG. 7 shows output characteristics of the IGBT in the case where its withstanding voltage is of a 4000 V class and its current density is 100 A/cm² at the rated current. In this figure, a curve labeled Si/SiC shows the characteristics of the embodiment wherein the IGBT is made of Si as the first semiconductor and SiC as the second semiconductor. A curve labeled Si shows the characteristics of the IGBT made of only silicon, and a curve labeled SiC shows the characteristics of the IGBT made of only silicon carbide. Although the start voltage of the hole injection is low voltage of 1.1 V in the instance where the IGBTs made with only Si, the gradient of the characteristic curve is small since the thickness of the n− layer is thick and the resistance of the n− layer is large. Then, the ON-voltage at the rated current is a large voltage of 7.2 V. On the other hand, the respective ON-voltage of the IGBT made of SiC and the IGBT made of only SiC are 2.2 V and 3.4 V, respectively, since the thickness of each n− layer is thin about 40 $\mu$m and the gradient of each characteristic curve is large. Therefore, the IGBT of the embodiment has the smallest ON-voltage.

FIG. 8 shows a relationship between the ON-voltage and the withstanding voltage of each of three IGBTs made of Si and SiC, only Si, and only Sic, respectively. When the withstanding voltage is low (less than about 900 V), the IGBT made with only Si has the lowest ON-voltage. However, for higher withstanding voltages, the thickness of the IGBT made of only Si needs to be made thicker and the ON-voltage becomes higher. For high withstanding voltages, the ON-voltage of the IGBT made of Si and SiC by the present invention is lowest. For example, for a withstanding voltage of $10^4$ V, the ON-voltage of the IGBT made of Si is 23 V. On the other hand, the IGBT of the present invention is 4 V, which is one sixth of the previously mentioned value.

Consequently, since the crystal growth of SiC is more difficult than that of Si, it is not easy to make a large wafer of SiC. Because it is possible to make a wafer of more than 10 cm of diameter, a semiconductor element of large diameter can be produced by using Si as the first semiconductor and SiC as the second semiconductor. Thus, it is better to make the n− layer as thin as possible within a range for securing the withstanding voltage. Since the breakdown voltage of SiC is larger by a figure than that of Si, the thickness of the n− layer can be reduced to one tenth of that of the n− layer of Si. For example, under the withstanding voltage of 4000 V, the n− layer thickness of 400 $\mu$m is necessary for Si. But, for SiC, only 40 $\mu$m is needed. If the n− layer become thinner, its mechanical strength becomes weaker. In order to secure the mechanical strength, the thickness of the p+ layer needs only to be made thicker. Thus the embodiment is advantageous for producing a large diameter of the wafer because increasing the thickness of the p+ layer by reducing the thickness of the n− layer is easily and cheaply realized.

Figure 9A:
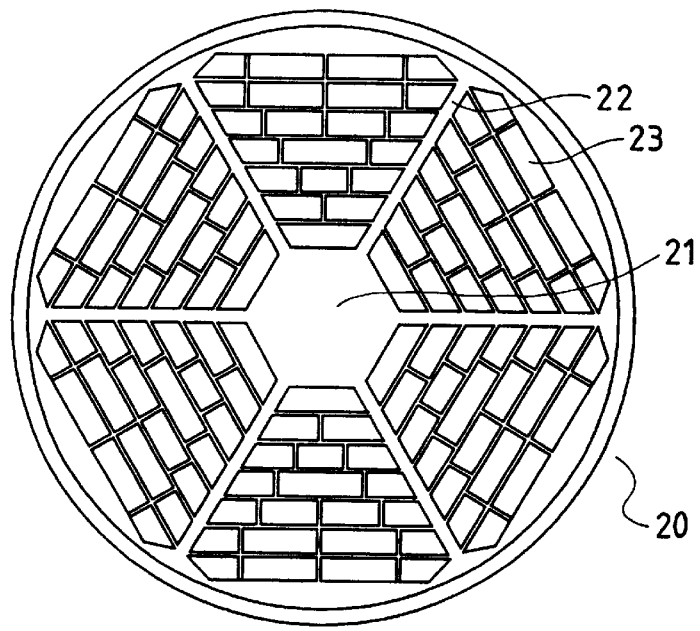
FIG. 9(a) is a plan view of an IGBT device formed on a circle wafer.
Figure 9B:
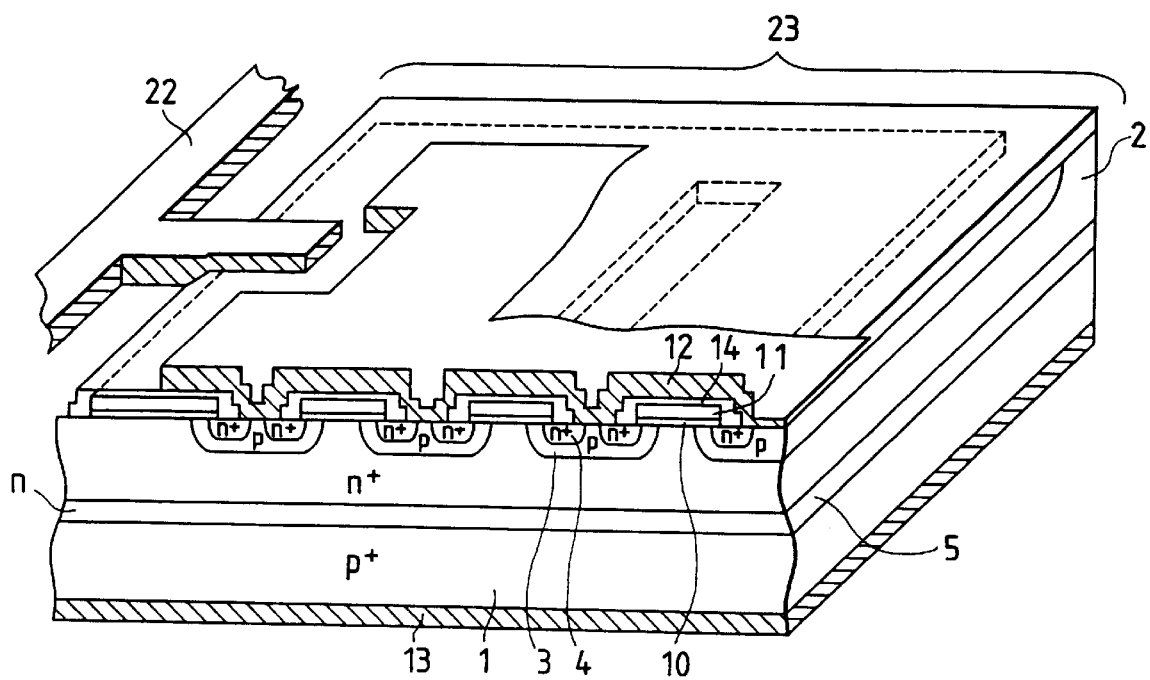
FIG. 9(b) is a cross-sectional view of a unit element of the IGBT device shown in FIG. 9(a).

FIG. 9(a) is a plan view of an IGBT device 20 in accordance with an embodiment of the present invention which is formed on a circle wafer. In this embodiment, gate wires 22 are extended radially from a gate pad 21, provided at a central portion of the IGBT devices, for taking out the gate wires 22 to outside. Many units 23 are arranged between the gate wires. FIG. 9(b) is a cross-sectional view of a unit element of the IGBT device 20. Many emitters extending in a selected direction are connected to an emitter electrode 12 included within the unit 23. At the terminal portion, a poly-silicon insulated gate electrode 11 contacts the gate wires 22. Further, the emitter electrode 12 is insulated from the poly-silicon insulated gate electrode 11 by a insulating layer 14.

Figure 10:
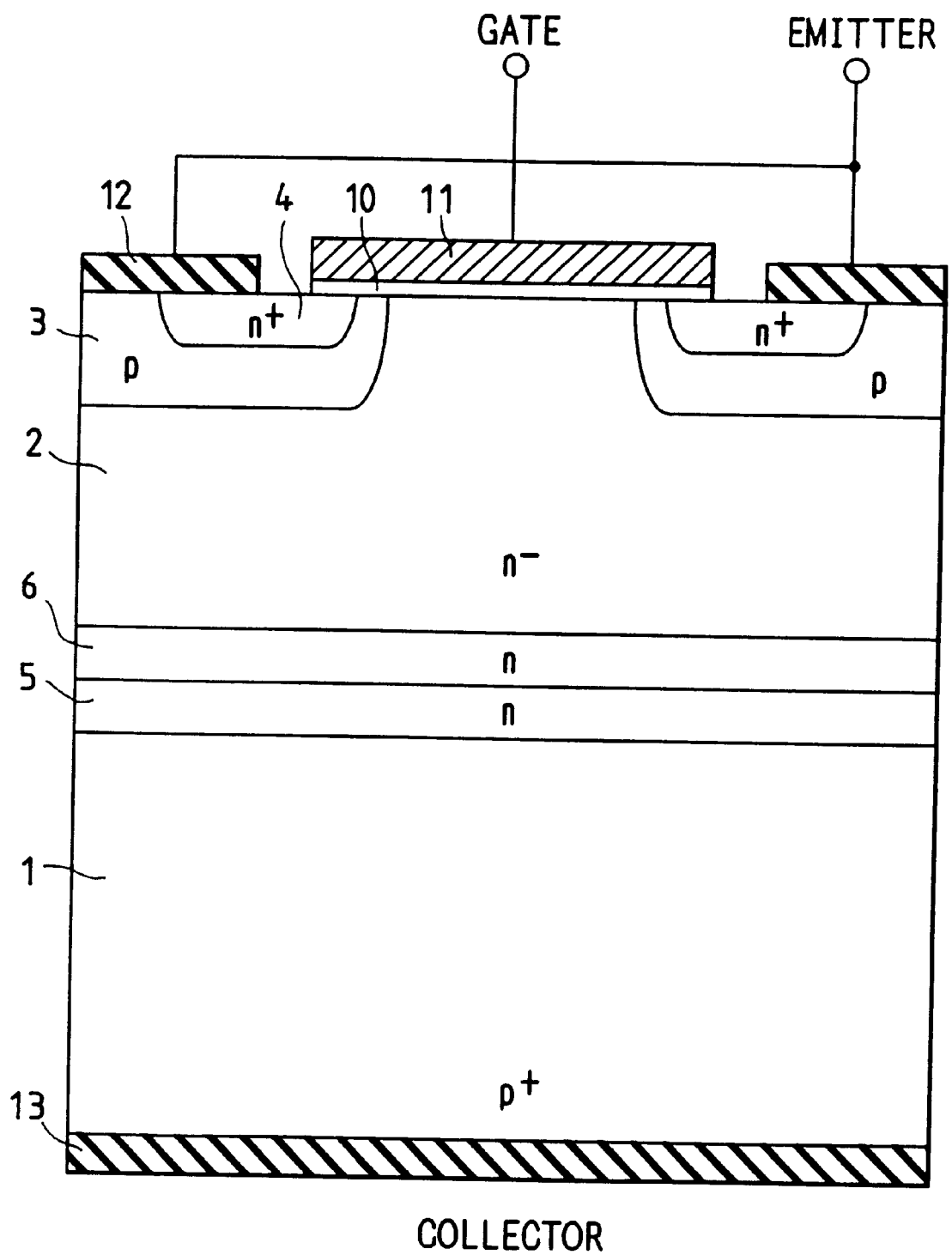
FIG. 10 is a cross-sectional view of an IGBT in accordance with a third embodiment of the present invention.

FIG. 10 is a cross-sectional view of an IGBT of a third embodiment of the present invention. As shown therein, an n layer 5 made of the first semiconductor is formed on the p+ substrate, made of the first semiconductor having the first band-gap. An n layer 6 (the sixth semiconductor layer) made of the second semiconductor is formed on the n layer 5, and the n− layer 2 made of the second semiconductor is formed on the n layer 6. The layers are constructed so that the impurity density of the n layers 5 and 6 is higher than that of the n− layer 2. Thus, except for n layer 6, the structure of the IGBT device shown in FIG. 10 is the same as that of the embodiment shown in FIG. 4.

In the third embodiment also, since the depletion layer growth is stopped by the n layer 6 of the high impurity density in the voltage stopping state, the thickness of the n− layer 2 is considerably reduced and the ON-voltage can be decreased, as well as the second embodiment. Further, since the n layer for stopping the depletion layer is made of the semiconductor having a band-gap wider than that of the first semiconductor, the leak current can be lowered as compared with the second embodiment.

Figure 11:
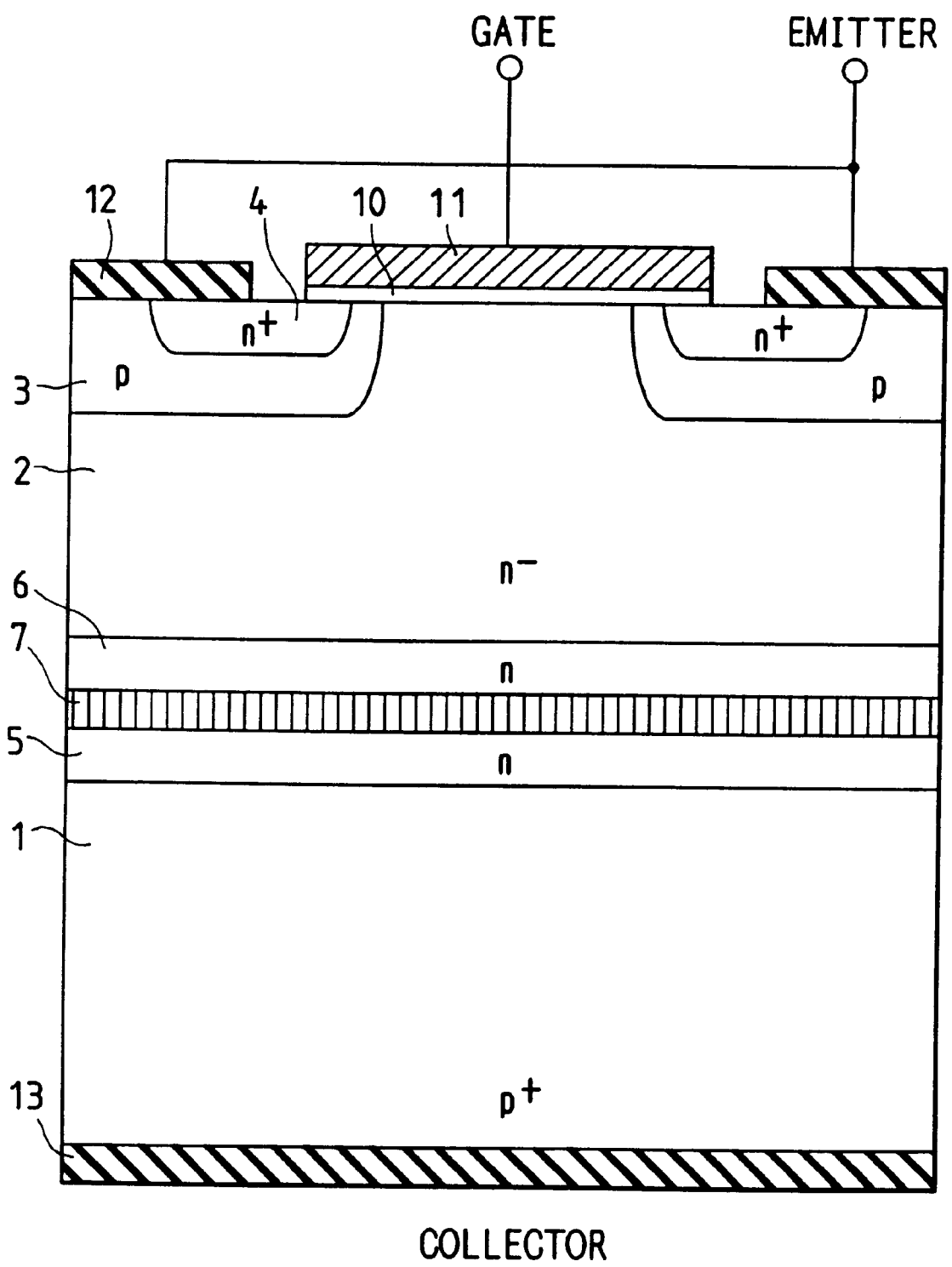
FIG. 11 is a cross-sectional view of an IGBT in accordance with a fourth embodiment of the present invention.

FIG. 11 is a cross-sectional view of an IGBT of a fourth embodiment of the present invention. In the fourth embodiment, a semiconductor layer 7 is provided between the n layer 5, made of the first semiconductor, and the n layer 6, made of the second semiconductor, in order to relax lattice distortion. For example, the lattice constant of Si is 5.43 Å. On the other hand, that of SiC is 3.09 Å. Thus, if both semiconductors are in direct contact with each other, the lattice distortion, and lattice defects caused by the lattice distortion, are generated as a result of the discrepancy that exists between the two lattice constants. By the lattice defects, the leak current increases. In the embodiment, the leak current can be decreased by providing the layer for relaxing the lattice distortion. Then, as the layer for relaxing the lattice distortion, the layer of which the lattice constant gradually changes from the constant of the layer of the one side to the constant of the layer of the another side, is preferable. For example, in the process of growing the crystal of SiC on a silicon substrate, a layer made by the following process is very preferable. That is, at first, only the crystal of silicon is grown, and the ratio of the contained carbon is gradually increased, and lastly SiC is grown. Methods of growing layers by gradually changing the composition of the semiconductor layer, such as the MBE (Molecular Beam Epi-taxy) method and the ALE (Atomic Layer Epi-taxy) method, are excellent from the view point of composition control.

In the above explanation, the present invention is applied to only IGBT devices. But, the present invention can be applied to such a device wherein injection of a minority carrier is generated by majority carriers such as with a thyristor, a gate turn-off thyristor (referred to GTO), and so forth.

Figure 12:
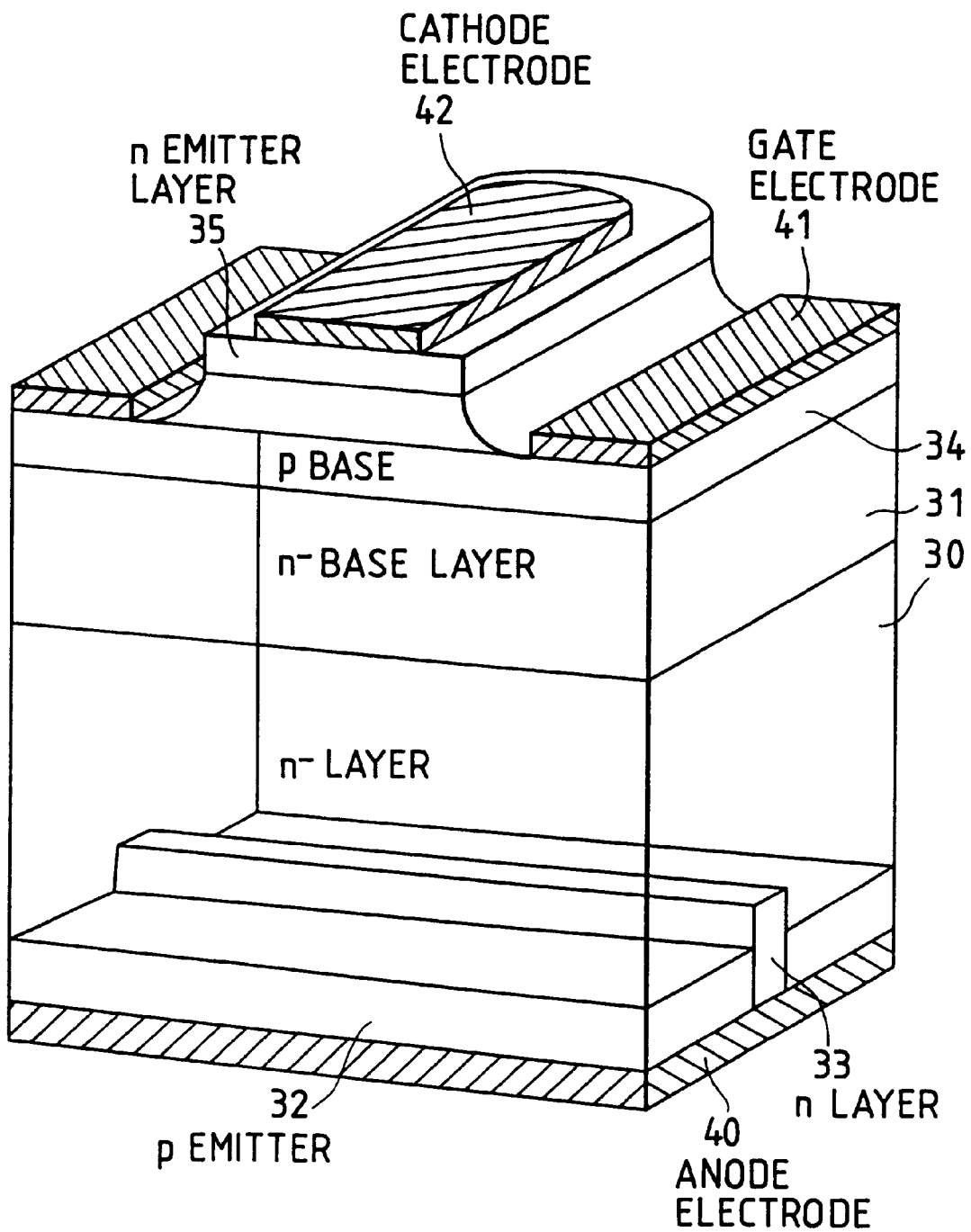
FIG. 12 is a cross-sectional view of a GTO of a fifth embodiment of the present invention.

FIG. 12 is a cross-sectional view of a GTO in accordance with a fifth embodiment of the present invention. At a side of an n− layer 30 made of the first semiconductor having the first band-gap, an n− base layer 31 (the second semiconductor layer), made of the second semiconductor having a larger band-gap than the first band-gap, is formed. At another side of the n− layer 30, a p emitter 32 (the first semiconductor layer) and a n layer 33 are formed. The p emitter 32 and the n layer are short-circuited by an anode electrode 40 (the first main electrode) ohmically contacting the both layers. A p base 34 (the third semiconductor) is formed on the n− base layer 31, and an n emitter layer (the fourth semiconductor layer) is selectively provided on a part of the p base 34. On the p base 34, a gate electrode 41 (a control electrode) ohmically contacting the base 34 is provided, and a cathode electrode 42 (the second main electrode) n is provided on the n emitter layer 35, ohmically contacting the layer 35. The first semiconductor is Si and the second semiconductor Sic.

Operation of the GTO is as follows. Positive voltage is applied to the anode electrode 40 and the gate electrode 41, against he cathode electrode 42. Then, the pn junction, composed of the n emitter layer 35 and the p base 34, is biased forward, and electrons flow into the n– base layer 31 from the n emitter layer 35. By the electrons, the pn junction, composed of the p emitter 32 and the n– layer 30, is biased forward and holes are injected into the n– base layer 31. For rapidly annihilating the holes and turning off the current in the turn-off state, the p emitter 32 and the n layer 33 are short-circuited by the anode electrode. Since the region into which carriers are injected from the p emitter is made with silicon, the increase in the ON-voltage that occurs at the pn junction is small. Further, since the n– layer 30, stopping voltage, is made with SiC, the thickness of the n– layer 30 can be reduced. Therefore, in addition to the advantage of having the ON-voltage reduced, the device of the fifth embodiment can advantageously be operated in the higher temperature state as compared with a device made of only silicon. Thus, it is possible to produce a GTO with a large area by using silicon for a substrate.

Figure 13:
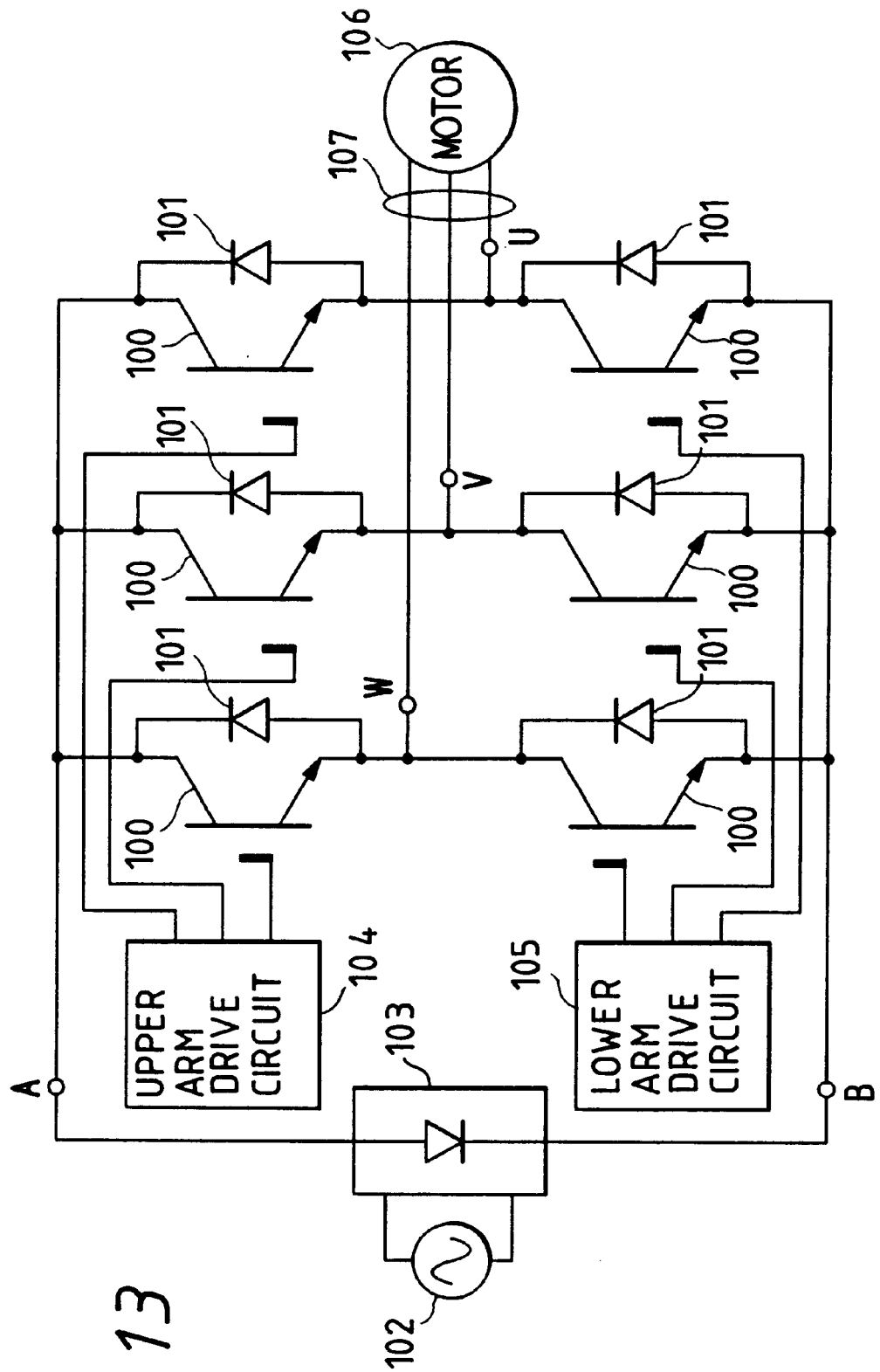
FIG. 13 shows an example of an inverter apparatus, used as a motor driving circuit, containing the semiconductor devices of the present invention.

FIG. 13 shows an example of an inverter apparatus used for a motor driving circuit, composed of the semiconductor devices 100 of the present invention. In this embodiment, IGBTs are used as the semiconductor devices. One inverter unit for one phase is constructed by connecting two IGBTs 100 in series. To each of the IGBTs, a fly-wheel diode 101 is connected inversely and in parallel. In each inverter unit, each connection point of the serially connected two IGBTs is connected to an alternating current terminal U (V, W). Each one of the alternating current terminals U, V and W is connected to a three-phase induction motor 106 by wiring 107. The collectors of IGBTs at the side of an upper arm are commonly connected to a direct current terminal A located at the high voltage side of a rectifying circuit 103. The emitters of IGBTs at the side of a lower arm are commonly connected to a direct current terminal B located at the low voltage side of a rectifying circuit 103. The rectifying circuit 103 rectifies alternating current from an alternating current power source 102 and feeds direct current to IGBTs. IGBTs 100 again change the direct current to alternating current power and drive the three-phase induction motor 106. Between the gates and the emitters at the side of the upper arm, an upper arm gate circuit 104 is provided. And, between the gates and the emitters at the side of the lower arm, a lower arm gate circuit 105 is provided. By this embodiment, it is possible to increase the efficiency of an inverter since loss in elements can be decreased.

Figure 14:
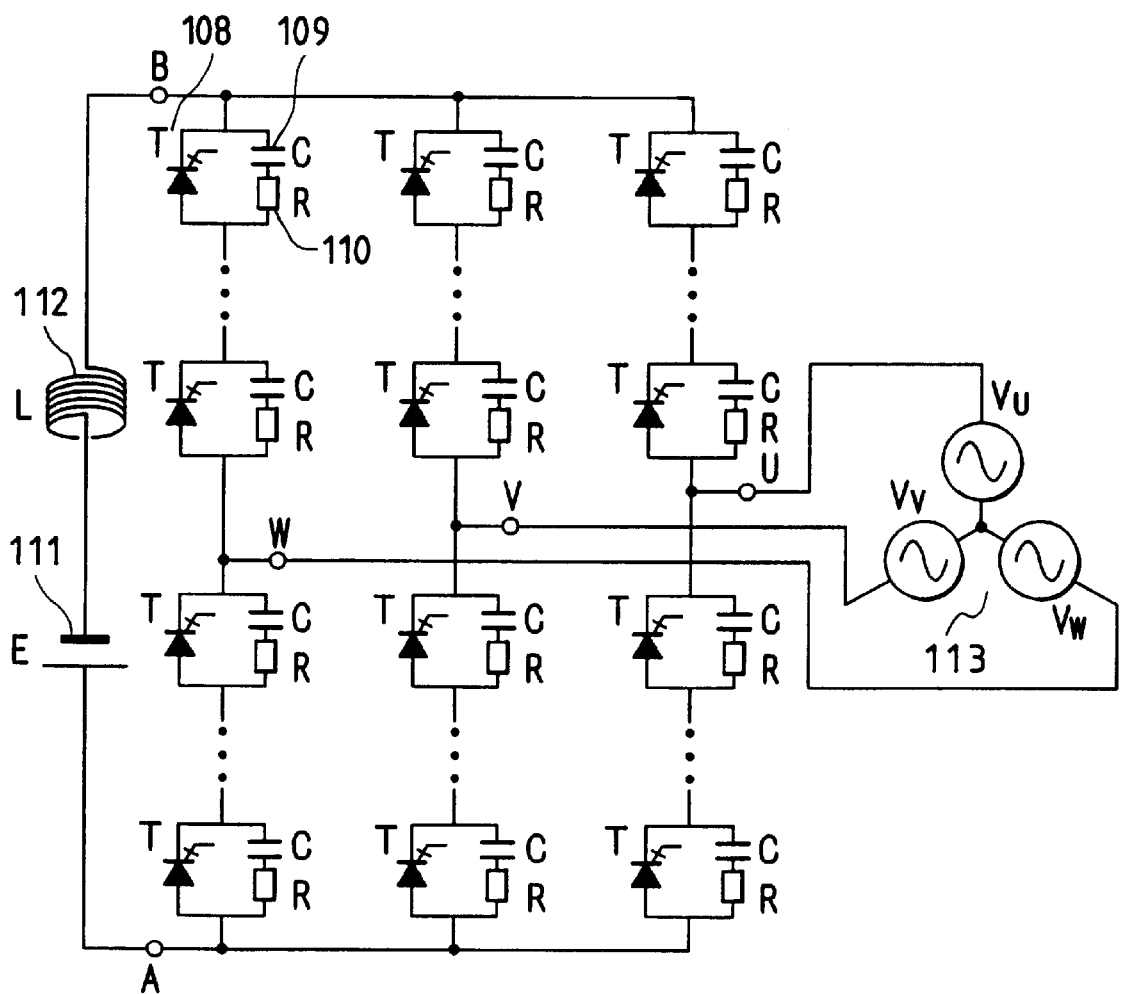
FIG. 14 shows an example of a high-voltage inverter circuit for changing power, transmitted by direct current, to alternating current, said circuit containing the semiconductor devices of the present invention.

FIG. 14 shows an example of a high-voltage inverter circuit for changing the power transmitted in direct current power to alternating current power. The circuit is composed of the semiconductor devices of the present invention. In this embodiment, the GTO shown in FIG. 12 is used as a semiconductor device. To each of the GTOs, a snubber circuit, composed of a condenser and a resistance serially connected to each other, is connected in parallel. In the embodiment shown in FIG. 13, the withstanding voltage is secured by one element. On the other hand, in the present embodiment, the withstanding voltage is secured by serially connecting plural elements. Then, three anode electrodes of the highest voltage are commonly connected to the high voltage side of a direct current power source. On the other hand, three cathode electrodes of the lowest voltage are commonly connected to the lowest voltage side of a direct current power source 111 via an inductance 112. The inductance 112 is provided to prevent GTOs 108 from being destroyed when a large current flows in GTOs in an accident occurrence at the load side. Alternating current power 113 is output from the middle point of each series of GTOs. Since the loss in a element by conventional GTOs using a device made with silicon increases as the applied voltage increases and the withstanding voltage can not be increased, many GTOs should be connected in each series of GTOs. For example, in the case of converting the 500 kV of direct current power, 100 pieces of GTOs is needed to be connected in one series of GTOs. Since the loss in a element does not increase so much by the present invention, the number of GTOs connected in the series of GTOs can be reduced, which reduces the loss and the size of an invertor.

In the above-explained embodiments, exchanging the p type layer with the n type layer can produce the same effect as mentioned above.

A semiconductor device to which the present invention can be applied is not restricted to IGBT and GTO devices. The present invention alternatively can be applied to a semiconductor device that comprises the first semiconductor layer made of the first conduction type semiconductor and the second semiconductor layer, adjoining the first semiconductor layer, made with the second conduction type semiconductor, such that a depletion layer extends into the second semiconductor layer in the voltage stopping state. Majority carriers in the second semiconductor layer are injected into the second semiconductor layer and the injected carriers cause carrier injection to occur from the first semiconductor layer in the ON state. Thus, for example, the present invention can be used as such a device as an electrostatic induction thyristor, a MOS control thyristor, and the like.

By the present invention, the loss and the leak current of a semiconductor device can be reduced. Further, the loss and the size of a power converting apparatus such as a invertor is also reduced. Then, such effects become more significant as the applied voltage become higher.

What is claimed is:

1. An inverter apparatus comprising:

a pair of direct current terminals;

a plurality of alternating current terminals, wherein the number of said alternating current terminals is equal to a phase number of alternating current outputs of the inverter apparatus; and a plurality of inverter units connected between said pair of direct current terminals, wherein the number of said inverter units is equal to a number of said alternating current outputs, including two serially connected arms, each of said arms having a circuit of a switching element connected in parallel with a diode whose polarity is inverse to that of said switching element, wherein mutual connection points of said arms are connected to said respective alternating current terminals, respectively, said switching element comprising:

a first semiconductor layer formed of a first conductivity type semiconductor, a second semiconductor layer formed of a second conductivity type semiconductor, adjoining said first semiconductor layer, a third semiconductor layer formed of said first conductivity type semiconductor, said third semiconductor layer being formed in said second semiconductor layer, and a fourth semiconductor layer formed of said second conductivity type semiconductor, formed in said third semiconductor layer, wherein a band-gap of said second conductivity type semiconductor used for forming the second semiconductor layer is larger than a band-gap of said first conductivity type semiconductor used for forming said first semiconductor layer.

2. An inverter apparatus according to claim 1, wherein each of said arms includes a plurality of circuits, each of said circuits having a switching element connected in parallel with a snubber.

3. An inverter apparatus comprising:

a pair of direct current terminals;

a plurality of alternating current terminals, wherein the number of said alternating current terminals is equal to a phase number of alternating current outputs of the inverter apparatus; and a plurality of inverter units connected between said pair of direct current terminal, wherein the number of said inverter units is equal to a number of said alternating current outputs, including two serially connected arms, each of said arms having a circuit of a switching element connected in parallel with a diode whose polarity is inverse to that of said switching element, wherein mutual connection points of said arms are connected to said respective alternating current terminals, respectively;

said switching element comprising:

a first semiconductor layer formed of a first conductivity type semiconductor, a second semiconductor layer formed of a second conductivity type semiconductor, adjoining said first semiconductor layer, a third semiconductor layer formed of said first conductivity type semiconductor, said third semiconductor layer being formed in said second semiconductor layer, a fourth semiconductor layer formed of said second conductivity type semiconductor, formed in said third semiconductor layer, a first main electrode contacting said first semiconductor layer, a second main electrode contacting said fourth semiconductor layer, and an insulated gate electrode provided on said third semiconductor layer, wherein a band-gap of said second conductivity type semiconductor used for forming the second semiconductor layer is larger than a band-gap of said first conductivity type semiconductor used for forming said first semiconductor layer.

4. An inverter apparatus according to claim 3, wherein each of said arms includes a plurality of circuits, each of said circuits having a switching element connected in parallel with a snubber.

5. An inverter apparatus comprising:

a pair of direct current terminals;

a plurality of alternating current terminals, wherein the number of said alternating current terminals is equal to a phase number of alternating current outputs; and a plurality of inverter units connected between said pair of direct current terminal, wherein the number of said inverter units is equal to a number of said alternating current outputs, including two serially connected arms, each of said arms having a circuit of a switching element connected in parallel with a diode whose polarity is inverse to that of said switching element, wherein mutual connection points of said arms are connected to said respective alternating current terminals, respectively;

said switching element comprising:

a first semiconductor layer formed of a first conductivity type semiconductor, a second semiconductor layer formed of a second conductivity type semiconductor, adjoining said first semiconductor layer, a third semiconductor layer formed of said first conductivity type semiconductor, said third semiconductor layer being formed in said second semiconductor layer, a fourth semiconductor layer formed of said second conductivity type semiconductor, formed in said third semiconductor layer, a first main electrode contacting said first semiconductor layer, a second main electrode contacting said fourth semiconductor layer, and a control electrode contacting said third semiconductor layer, wherein a band-gap of said second conductivity type semiconductor used for forming the second semiconductor layer is larger than a band-gap of said first conductivity type semiconductor used for forming said first semiconductor layer.

6. An inverter apparatus according to claim 5, wherein each of said arms includes a plurality of circuits, each of said circuits having a switching element connected in parallel with a snubber.

7. An inverter apparatus comprising:

a pair of direct current terminals;

a plurality of alternating current terminals, wherein the number of said alternating current terminals is equal to a phase number of alternating current outputs; and a plurality of inverter units connected between said pair of direct current terminal, wherein the number of said inverter units is equal to a number of said alternating current outputs, including two serially connected arms, each of said arms having a circuit of a switching element connected in parallel with a diode whose polarity is inverse to that of said switching element, wherein mutual connection points of said arms are connected to said respective alternating current terminals, respectively;

said switching element comprising:

a first semiconductor layer formed of a first conductivity type;

a second semiconductor layer formed of a second conductivity type semiconductor adjoining the first semiconductor layer, means formed in said second semiconductor layer for providing carriers as major carriers to said second semiconductor layer; and means for injecting said carriers as major carriers of said second semiconductor layer into said first semiconductor layer during an ON-state of the semiconductor device, wherein a band-gap of said second conductivity type semiconductor used for forming the second semiconductor layer is larger than a band-gap of said first conductivity type semiconductor used for forming said first semiconductor layer.

8. An inverter apparatus according to claim 7, wherein each of said arms includes a plurality of circuits, each of said circuits having a switching element connected in parallel with a snubber.

* * * * *